United States Patent
Wang et al.

(10) Patent No.: US 9,654,102 B2
(45) Date of Patent: May 16, 2017

(54) HYBRID DIRECT-CURRENT CIRCUIT BREAKER

(71) Applicant: General Electric Company, Schenectady, NY (US)

(72) Inventors: Ruxi Wang, Niskayuna, NY (US); William James Premerlani, Scotia, NY (US); Antonio Caiafa, Albany, NY (US); Yan Pan, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 209 days.

(21) Appl. No.: 14/510,575

(22) Filed: Oct. 9, 2014

(65) Prior Publication Data
US 2016/0105018 A1    Apr. 14, 2016

(51) Int. Cl.
*H02H 9/08* (2006.01)
*H03K 17/92* (2006.01)
*H01H 9/54* (2006.01)

(52) U.S. Cl.
CPC ............ *H03K 17/92* (2013.01); *H01H 9/541* (2013.01)

(58) Field of Classification Search
CPC ...................................... H02H 9/023
USPC ........................................ 361/93.1
See application file for complete search history.

(56) References Cited

U.S. PATENT DOCUMENTS

| | | | |
|---|---|---|---|
| 4,700,257 A | 10/1987 | Bekhaled | |
| 5,121,281 A | 6/1992 | Pham et al. | |
| 5,250,508 A | 10/1993 | Pham | |
| 5,450,266 A | 9/1995 | Downie | |
| 7,544,108 B2 | 6/2009 | Rzadki et al. | |
| 7,742,264 B2 * | 6/2010 | Hyun | H02H 7/001 335/216 |

FOREIGN PATENT DOCUMENTS

| | | |
|---|---|---|
| EP | 0359125 A1 | 3/1990 |
| EP | 2465129 B1 | 4/2013 |
| FR | 2621734 A1 | 4/1989 |

OTHER PUBLICATIONS

AC Power Conditioner, SINE, 3 Pages., downloaded Oct. 8, 2014 from http://www.sineworld.com/html/product_1.html.
Eckroad, "Superconducting Fault Current Limiters", Technical Watch, 2009, 09 Pages.

* cited by examiner

*Primary Examiner* — Dharti Patel
(74) *Attorney, Agent, or Firm* — Ann M. Agosti

(57) ABSTRACT

A circuit breaking system includes a first branch including at least one solid-state snubber; a second branch coupled in parallel to the first branch and including a superconductor and a cryogenic contactor coupled in series; and a controller operatively coupled to the at least one solid-state snubber and the cryogenic contactor and programmed to, when a fault occurs in the load circuit, activate the at least one solid-state snubber for migrating flow of the electrical current from the second branch to the first branch, and, when the fault is cleared in the load circuit, activate the cryogenic contactor for migrating the flow of the electrical current from the first branch to the second branch.

17 Claims, 2 Drawing Sheets

HYBRID DIRECT-CURRENT CIRCUIT BREAKER

STATEMENT REGARDING FEDERALLY SPONSORED RESEARCH & DEVELOPMENT

Figure 1:
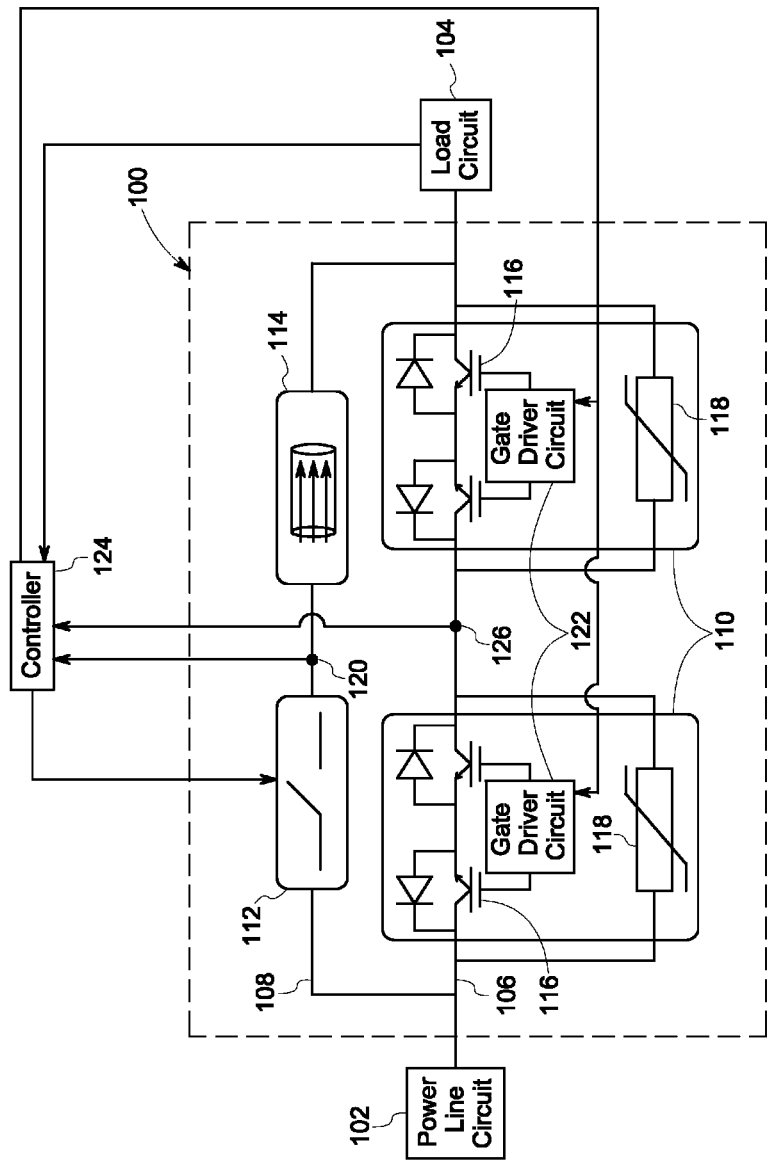

The invention described herein was made in the performance of work under NASA Contract No. NNC10BA06B and is subject to the provisions of Section 305 of the National Aeronautics and Space Act of 1958 (42 U.S. C. 2457).

BACKGROUND

The disclosure relates generally to a power protection system and more specifically to a direct-current (DC) circuit breaker in the power protection system.

Power systems are widely used for generating and distributing power to one or more load devices. However, these power systems may be damaged by short circuits and/or fault current in the load devices. To protect these power systems, circuit breakers are used for instantaneously sensing the fault current and isolating the power systems from the load devices.

In some conventional power systems, electromagnetic circuit breakers are used in conjunction with suitable means for sensing the fault current. However, these electromagnetic circuit breakers are large in size. Also, the electromagnetic circuit breakers have response times which are undesirably high for some applications, such as aircraft engines.

In other conventional power systems, solid-state circuit-breakers may be used to sense the fault current. Typically, the solid-state circuit-breakers employ high power semiconductors that provide a fast response time to control the fault current. However, the on-resistance of the semiconductors reduces efficiency due to high conduction and/or electrical losses.

Thus, there is a need for a circuit breaker that provides a good response time without unduly sacrificing the efficiency of the power system and having a reduced footprint.

BRIEF DESCRIPTION

One embodiment described herein is a method for operating a circuit breaker. The circuit breaker is coupled between a power line circuit (PLC) and a load circuit and includes a first branch including at least one solid-state snubber, a second branch coupled in parallel to the first branch and including a superconductor, and a cryogenic contactor coupled to the superconductor. The method includes, when an electrical current from the PLC is below a PLC threshold current value, supplying the electrical current from the PLC to the load circuit through the second branch; and, when the electrical current from the PLC is above the PLC threshold current value, inhibiting flow of the electrical current in the second branch, supplying the electrical current from the PLC to the load circuit via the first branch, and then deactivating the at least one solid-state snubber.

In accordance with a further aspect of the present disclosure, a circuit breaking system includes a first branch including at least one solid-state snubber, and a second branch coupled in parallel to the first branch and including a superconductor and a cryogenic contactor coupled in series. The circuit breaking system further includes a controller operatively coupled to the at least one solid-state snubber and the cryogenic contactor and programmed to, when a fault occurs in the load circuit, activate the at least one solid-state snubber for migrating flow of the electrical current from the second branch to the first branch, and, when the fault is cleared in the load circuit, activate the cryogenic contactor for migrating the flow of the electrical current from the first branch to the second branch.

DRAWINGS

Figure 2:
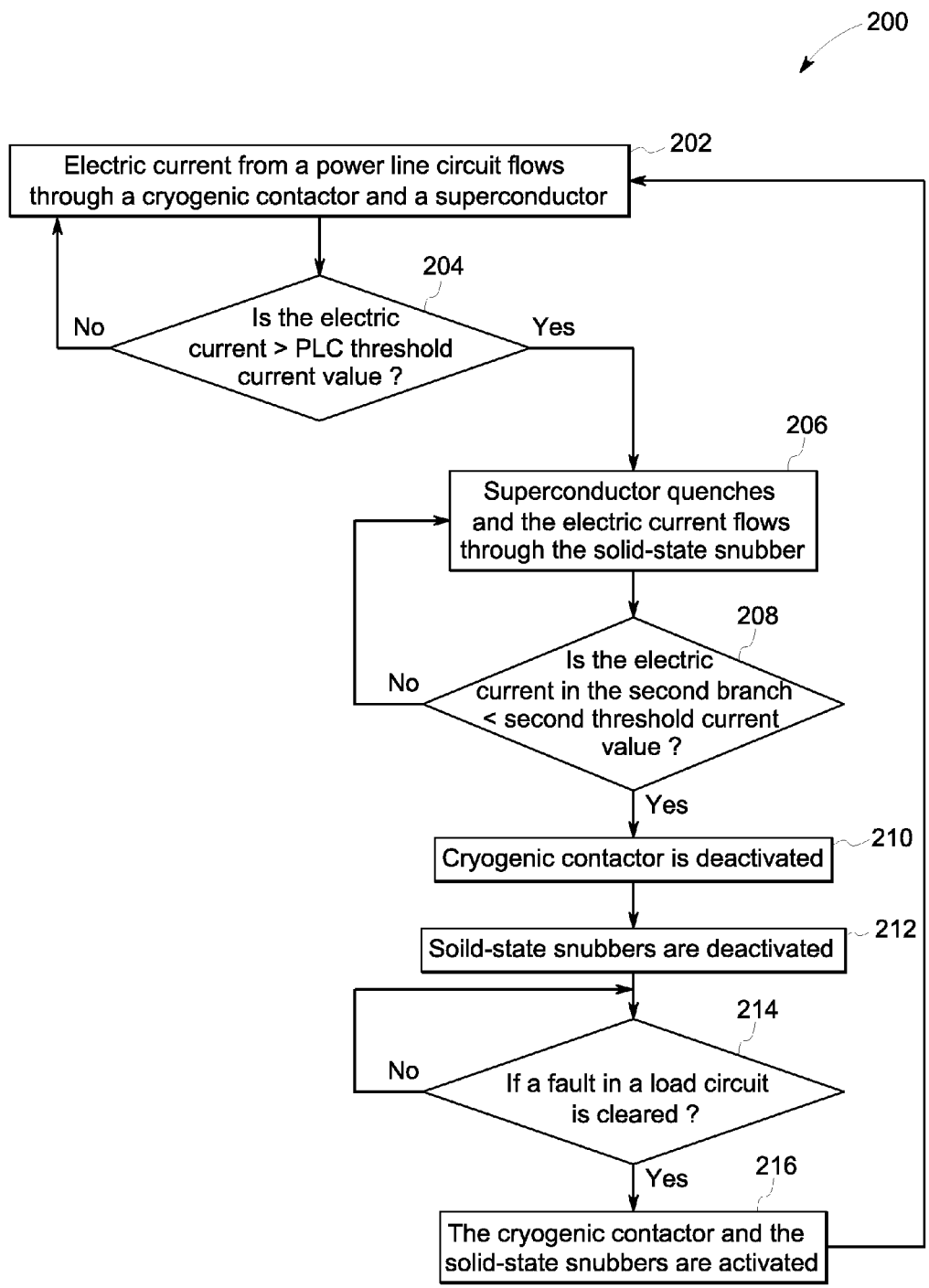

These and other features, aspects, and advantages of the present invention will become better understood when the following detailed description is read with reference to the accompanying drawings in which like characters represent like parts throughout the drawings, wherein:

FIG. 1 is a diagrammatical representation of a circuit breaker, in accordance with one embodiment of the present disclosure; and FIG. 2 is a flow chart illustrating a method for isolating a power line circuit from a load circuit, in accordance with aspects of the present disclosure.

DETAILED DESCRIPTION

As will be described in detail hereinafter, various embodiments of an exemplary circuit breaker for isolating a power line circuit from the load circuit are presented. By employing the methods and the various embodiments of the circuit breaker described hereinafter, response time may be improved without sacrificing efficiency as the circuit breaker provides very low impedance to the flow of electrical current under normal operating conditions and keeping a reduced footprint.

Referring to FIG. 1, a diagrammatical representation of a circuit breaker 100, in accordance with one embodiment of the present disclosure, is depicted. The circuit breaker 100 is electrically coupled between a power line circuit 102 and a load circuit 104. The circuit breaker 100 is typically used to control flow of electrical current from the power line circuit 102 to the load circuit 104. The power line circuit 102 may be referred to as a power source that generates and/or distributes electrical power to one or more load circuits. Similarly, the load circuit 104 may be referred to as a load device or an electrical system that receives the electrical power.

In general, the circuit breaker 100 may be employed to isolate the power line circuit 102 from the load circuit 104 when a fault occurs in the load circuit 104. In one example, the fault may include a short circuit or overloading in the load circuit 104. Particularly, when such a fault occurs in the load circuit 104, the electrical current flowing through the circuit breaker 100 may increase above a power line circuit (PLC) threshold current value. In such situations, it is desirable for the circuit breaker 100 to isolate the power line circuit 102 from the load circuit 104 until the fault in the load circuit 104 is cleared in order to prevent any damage to the power line circuit 102 due to the fault in the load circuit 104.

In a presently contemplated configuration, the circuit breaker 100 includes a first branch 106, a second branch 108, a controller 124, a first sensor 126, and a second sensor 120. The first branch 106 and the second branch 108 are coupled in parallel to each other, and the controller 124 may be operatively coupled to one or more components of the first and second branches 106, 108. Further, the first sensor 126 may be electrically coupled to the first branch 106 to sense or determine the electrical current flowing through the first branch 106. Similarly, the second sensor 120 may be electrically coupled to the second branch 108 to sense or determine the electrical current flowing through the second branch 108. In addition, the first and second sensors 126, 120 may send sensor signals corresponding to the determined electrical current to the controller 124. In one example, the first sensor 126 may send a first sensor signal, while the second sensor 120 may send a second sensor signal to the controller 124. Further, the controller 124 may activate or deactivate the one or more components of the first and second branches 106, 108 based on the sensor signals received from the first and second sensors 126, 120. In addition, the controller 124 may be operatively coupled to the load circuit 104 to receive a signal indicating that the fault is cleared in the load circuit 104.

As depicted in FIG. 1, the first branch 106 includes one or more solid-state snubbers 110. In one embodiment, the one or more solid-state snubbers 110 each comprise one or more semiconductor switches 116, a gate driver circuit 122, and one or more passive components 118. In one example, the one or more semiconductor switches 116 may be MOSFETs, IGBTs, Thyristors, MCTs, and/or power BJTs. Also, the one or more semiconductor switches 116 may be fabricated using Silicon (Si), Germanium (Ge), a combination of Silicon and Germanium (SiGe), or any other material suitable for very low temperature applications. In one embodiment, the semiconductor switches 116 may be activated or operated in the ON state during normal operation. In another embodiment, the semiconductor switches 116 may be deactivated or operated in an OFF state during normal operation, and the semiconductor switches 116 may be activated or turned ON when a fault is detected in the load circuit 104.

Furthermore, the gate driver circuit 122 may be operatively coupled to the one or more semiconductor switches 116 to activate or deactivate the switches 116. Particularly, the gate driver circuit 122 may receive one or more control signals from the controller 124, and, accordingly, the gate driver circuit 122 may activate or deactivate the switches 116. Also, it may be noted that the term "activating solid state snubber" as used herein may refer to activating the semiconductor switches 116 in the corresponding solid state snubber. Similarly, the term "deactivating solid state snubber" as used herein may refer to deactivating the semiconductor switches 116 in the corresponding solid state snubber.

The one or more passive components 118 may include, for example, metal oxide varistors (MOV) and/or snubber caps (not shown). In one example, the one or more passive components 118 may be used to dissipate heat that is generated by resistive losses in the semiconductor switches 116.

In the embodiment of FIG. 1, the second branch 108 includes a cryogenic contactor 112 and a superconductor 114 that are electrically coupled in series with each other. The superconductor 114 may have a critical current value that is selected or determined based on the geometric dimension of the superconductor 114 and an operating temperature of the superconductor 114. Further, the superconductor 114 operates in a superconducting state when the temperature of the superconductor 114 is below the operating temperature and the current flowing through the superconductor 114 is below the critical current value. In the superconducting state, the superconductor 114 has zero or negligible impedance, and thus the electrical current flowing through the superconductor 114 has zero or negligible electrical losses.

Further, if the current through the superconductor 114 exceeds the critical current value, the superconductor 114 may quench or exit its superconductive state and transition to operate in a resistive state. This in turn may develop a voltage drop across the superconductor 114. The voltage drop may be proportional to the current flowing through the superconductor 114 and the resistance of the superconductor material when the superconductor 114 is not in the superconductive state. In addition, resistive losses in the superconductor 114 may generate heat across the superconductor 114.

Further, when the current into the superconductor 114 continues to increase after exceeding the critical current value, the heat generated by the resistive losses increases the temperature of the superconductor 114 above the operating temperature. This in turns makes the superconductor 114 even more resistive, and may not allow the superconductor 114 to move to the superconductive state again until the current decreases well below the critical current value and the temperature of the superconductor 114 decreases below the operating temperature. Thus, the superconductor 114 and the operating temperature may be designed to provide a specific critical current value. In the exemplary embodiment, superconductive element of the superconductor 114 may be designed such that its critical current value at the operating temperature is equal to the PLC threshold current value. Moreover, in the resistive state, the superconductor 114 will have resistance that is much greater than the resistance of the one or more solid-state snubbers 110 in the first branch 106.

Thus, the second branch 108 operates as the primary path for the electrical current to flow from the power line circuit 102 to the load circuit 104 under normal operating conditions, and the first branch 106 is used as a transient path for the electrical current to flow from the power line circuit 102 to the load circuit 104 when the power line circuit current exceeds the PLC threshold current value. When current is described herein as "flowing" through the first or second branch, it is meant that the flow is primarily through the first or second branch and, unless a contactor 112 or switch 116 is described as being in an open, non-conducting position, is not meant to exclude the possibility of some small amount of current passing through the other branch.

In one embodiment, the cryogenic contactor 112 and the superconductor 114 are disposed in a cryogenic tank (not shown) to maintain temperature of the cryogenic contactor 112 and the superconductor 114. Particularly, the superconductor 114 may have a nominal current value at which the superconductor 114 is preferred to operate when there is no fault in the system 100. The cryogenic tank (not shown) is used to maintain the temperature of the cryogenic contactor 112 and the superconductor 114 such that the nominal current value is maintained below the critical current value or the PLC threshold current value. In one embodiment, the circuit breaker 100 may be disposed in a separate cryogenic tank (not shown) or within an already existing cryogenic system including superconducting electrical generation as well as superconducting motors (not shown).

In one embodiment, the cryogenic tank maintains the temperature of the cryogenic contactor 112 and the superconductor 114 when the current in the second branch 108 is below the PLC threshold current value. However, when the current exceeds the PLC threshold current value, the superconductor 114 may quench and may lose the zero resistance capability. Also, after the quench, the superconductor 114 may have high resistance and may generate significant internal heat, which in turn increases the operating temperature of the superconductor 114. Until further actions are taken, the superconductor 114 will not switch back to the superconducting state after the quench.

In one embodiment, the cryogenic contactor 112 is deactivated (that is, transitioned from conducting current to not conducting current) when the electrical current flowing through the cryogenic contactor 112 is below a second threshold current value. In one example, the second threshold current value may be referred to as maximum interruptible current. In one example, the second threshold current value is less than the nominal current value. In a further embodiment, the cryogenic contactor 112 is activated (that is, transitioned from not conducting current to conducting current) when the expected electrical current flowing through the cryogenic contactor 112 is above the second threshold current value and below the nominal current value. During operation, the power line circuit 102 distributes power to the load circuit 104 via the circuit breaker 100. If there is no fault in the load circuit 104, the electrical current flowing through the circuit breaker 100 will be below the PLC threshold current value. Hence, the electrical current from the power line circuit 102 will flow through the second branch 108 to reach the load circuit 104. Particularly, the electrical current will flow through the cryogenic contactor 112 and the superconductor 114 in the second branch 108 to reach the load circuit 104.

When a fault occurs in the load circuit 104, the electrical current in the second branch 108 may increase above the PLC threshold current value. As discussed above, when the electrical current flowing through the cryogenic contactor 112 and the superconductor 114 increases above the PLC threshold current value, the superconductor 114 will quench and switch from the superconducting state to the resistive state. In the resistive state, the superconductor 114 may self-heat due to resistive losses and become even more resistive.

When the superconductor 114 enters the resistive state, in embodiments wherein the solid-state snubbers 110 are in an active state during normal operation, the impedance of the superconductor 114 will automatically increase above the impedance in the first branch 106, which in turn will cause the electrical current to flow from the power line circuit 102 through the first branch 106 to reach the load circuit 104. In such embodiments, the solid-state snubbers 110 remain activated or are in the ON state (that is keeping the switches 116 ON) during normal condition. In another embodiment, the solid-state snubbers 110 are deactivated or are in the OFF state (that is keeping the switches 116 OFF) during the normal condition, and, when the fault is detected, the solid-state snubbers 110 are activated or switched to ON state. In one more specific aspect of this embodiment, when the controller receives a signal indicating that the current in the second branch 108 is above the PLC threshold current value, the controller 124 sends a control signal to the solid-state snubbers 110 to activate the solid-state snubbers 110 so as to provide a transient path for the electrical current to flow through the circuit breaker 100. In one example, the second sensor 120 may be configured to send a second sensor signal representative of the current in the second branch 108 continuously, periodically, or only when triggered by the threshold event, and the controller 124 activates the solid-state snubbers 110 when the second sensor signal is increased above the PLC threshold current value.

As the current flow from the power line circuit 102 to the load circuit 104 migrates from the second branch 108 to the first branch 106, the electrical current in the second branch 108 will decrease. When the current in the second branch 108 has decreased below the second threshold current value (that is, most of the fault current has migrated from the second branch 108 into the first branch 106), in one embodiment the controller 124 sends a control signal to the cryogenic contactor 112 to deactivate or switch OFF the cryogenic contactor 112. In one example, the controller 124 may deactivate the cryogenic contactor 112 when the second sensor signal is reduced below the second threshold current value. Further, deactivating the cryogenic contactor 112 results in current ceasing to flow through the superconductor 114. After the electrical current flowing through the superconductor 114 ceases, the temperature of the superconductor 114 will gradually decrease. The superconductor 114 may renter the superconducting state when its inner temperature is fully reduced to the operating temperature.

The controller 124 may further send a control signal to the solid-state snubbers 110 to deactivate the solid-state snubbers 110. When both the cryogenic contactor 112 and the solid-state snubbers 110 are in OFF conditions, the electrical current no longer flows through the circuit breaker 100. If desired, in addition to or instead of the controller 124 automatically sending the control signal to deactivate the solid-state snubbers, the one or more solid-state snubbers 110 may be manually deactivated.

Furthermore, in one embodiment, when the fault in the load circuit 104 is cleared, the controller 124 may receive a signal from the load circuit 104 indicating that the fault has been cleared in the load circuit 104 and then may send a control signal to the solid-state snubbers 110 to activate or turn ON the solid-state snubbers 110. This in turn provides a path for the current to flow through the first branch 106. In a more specific aspect of this embodiment, when the current in the first branch 106 increases above the second threshold current value and below the nominal current value, and the superconductor 114 has returned to a superconducting state, the controller 124 may send a control signal to reactivate the cryogenic contactor 112. In one example, the first sensor 126 may send a first sensor signal representative of current in the first branch to the controller 124, and the controller 124 may activate the cryogenic contactor 112 when the fault is cleared and the first sensor signal is above the second threshold current value and below a nominal current value. Further, once the cryogenic contactor 112 is reactivated, the current flow may migrate from the first branch 106 to the second branch 108 as the superconductor 114 is switched back to the superconducting state and the impedance in the second branch 108 is less than the impedance in the first branch 106.

In another embodiment, when the fault in the load circuit 104 is cleared and when the superconductor 114 is not back to the superconducting state/mode yet, the solid-state snubbers 110 may be activated (switches 116 may be turned ON) to allow the electrical current to flow through the circuit breaker 100. When the voltage across the circuit breaker 100 decreases to several volts, the cryogenic contactor 112 may be reactivated. As the inner temperature of the superconductor 114 decreases, the critical current of the superconductor 114 increases and the resistivity of the superconductor 114 decreases. This in turn allows for a soft migration of the current from the first branch 106 to the second branch 108. This soft migration greatly decreases the stress on the cryogenic contactor 112. Further, the system 100 may be fully restored when all the current flows through the second branch 108.

In either of the two post fault embodiments described above, the solid-state snubbers may either be left in an ON state or may be moved to an OFF state after the current is again flowing through the second branch 108.

Referring to FIG. 2, a flow chart illustrating a method for isolating a power line circuit 102 from a load circuit 104, in accordance with aspects of the present disclosure, is depicted. For ease of understanding, the method 200 is described with reference to the components of FIGS. 1 and 2. The method 200 begins with step 202, where electrical current from the power line circuit 102 flows through the second branch 108 of the circuit breaker 100. Particularly, the superconductor 114 in the second branch 108 at this point has an impedance that is less than an impedance of the solid-state snubbers 110 in the first branch 106 when the electrical current is below a PLC threshold current value. Hence, the electrical current flows through the superconductor 114 in the second branch 108 of the circuit breaker 100.

Subsequently, at step 204, if the electrical current flowing through the superconductor 114 increases above the PLC threshold current value, the method moves to step 206. At step 206, the superconductor 114 may quench and may move to the resistive state. At this stage, the impedance in the second branch 108 increases above the impendance in the first branch 106. Thus, the electrical current flow migrates from the second branch 108 to the first branch 106. Particularly, the electrical current from the PLC 102 flows through the solid-state snubbers 110 to reach the load circuit 104. The solid-state snubbers 110 may either remain active or in the ON state during normal condition (no fault in the load circuit 104) or may be deactivated or in the OFF state during the normal condition and then, when the fault is detected, be activated or switched to ON state.

After the transition of current flow from the second branch 108 to the first branch 106, at step 208, the amount of electrical current in the second branch 108 is verified. If the electrical current in the second branch 108 is reduced below the second threshold current value, the method moves to step 210. At step 210, the cryogenic contactor 112 is deactivated to cease the current from flowing through the superconductor 114.

Additionally, at step 212, the solid-state snubbers 110 are deactivated to completely cease the electrical current from flowing through the circuit breaker 100. In one embodiment, the one or more solid-state snubbers 110 may be manually or automatically deactivated to cease the current flow and to completely isolate the load circuit 104 from the PLC 102.

Subsequently, at step 214, it is determined whether the fault is cleared. If the fault is cleared, the method moves to step 216, where the solid-state snubbers 110 may be activated to allow the electrical current to flow through the circuit breaker 100. Further, when the electrical current is increased above the second threshold current value and below the nominal current value, the cryogenic contactor 112 is activated to allow the electrical current to flow from the power line circuit 102 through the cryogenic contactor 112 and the superconductor 114. In one embodiment, the solid-state snubbers 110 may remain activated even after electrical current is flowing through the superconductor 114 to provide an automated transient path for the electrical current to flow when a fault occurs in the load circuit 104. In another embodiment, the solid-state snubbers 110 may be deactivated when the current is flowing through the superconductor 114 under normal operating conditions and then be reactivated by the controller after the fault occurs in the load circuit 104.

The various embodiments of the system and the method may be used for improving response time of the circuit breaker to isolate the power line circuit from the load circuit when a fault occurs in the load circuit while still enabling good efficiency of the system.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for operating a circuit breaker coupled between a power line circuit (PLC) and a load circuit and comprising a first branch comprising at least one solid-state snubber, a second branch coupled in parallel to the first branch and comprising a superconductor, and a cryogenic contactor coupled to the superconductor, the method comprising:
when an electrical current from the PLC is below a PLC threshold current value, supplying the electrical current from the PLC to the load circuit through the second branch;
when a fault in the load circuit occurs such that the electrical current from the PLC is above the PLC threshold current value, inhibiting flow of the electrical current in the second branch, supplying the electrical current from the PLC to the load circuit via the first branch, and then deactivating the at least one solid-state snubber; and
when the fault in the load circuit is cleared, activating the at least one solid-state snubber to supply the electrical current from the PLC to the load circuit via the first branch.

2. The method of claim 1, further comprising, during the fault in the load circuit, deactivating the cryogenic contactor after the electrical current flowing through the second branch is reduced to a second threshold current value.

3. The method of claim 2, wherein the deactivating of the at least one solid-state snubber occurs after the deactivating of the cryogenic contactor.

4. The method of claim 1, further comprising, when the fault in the load circuit is cleared, reactivating the cryogenic contactor when the electrical current in the first branch is above the second threshold current value and below a nominal current value.

5. The method of claim 1, wherein supplying the electrical current from the PLC to the load circuit via the first branch comprises activating the at least one solid-state snubber.

6. A circuit breaking system configured for being coupled between a power line circuit (PLC) and a load circuit, the circuit breaking system comprising:
a first branch comprising at least one solid-state snubber; and
a second branch coupled in parallel to the first branch and comprising a superconductor and a cryogenic contactor coupled in series; and
a controller operatively coupled to the at least one solid-state snubber and the cryogenic contactor and programmed to:
when a fault occurs in the load circuit, activate the at least one solid-state snubber for migrating flow of the electrical current from the second branch to the first branch; and
when the fault is cleared in the load circuit, reactivating the at least one solid-state snubber to supply the electrical current from the PLC to the load circuit via the first branch and then activating the cryogenic contactor for migrating the flow of the electrical current from the first branch to the second branch.

7. The circuit breaking system of claim 6, further comprising a first sensor operatively coupled to the first branch for providing a first sensor signal representing the electrical current in the first branch.

8. The circuit breaking system of claim 7, wherein the controller is programmed for activating the cryogenic contactor when the fault is cleared and the first sensor signal is above a second threshold current value and below a nominal current value.

9. The circuit breaking system of claim 6, further comprising a second sensor operatively coupled to the second branch and configured to provide a second sensor signal representing the electrical current in the second branch.

10. The circuit breaking system of claim 9, wherein the controller identifies the fault in the load circuit based on the second sensor signal.

11. The circuit breaking system of claim 10, wherein the controller activates the at least one solid-state snubber when the fault occurs in the load circuit and the second sensor signal is increased above a PLC threshold current value.

12. The circuit breaking system of claim 9, wherein the controller deactivates the cryogenic contactor when the second sensor signal is reduced below the second threshold current value.

13. The circuit breaking system of claim 6, wherein the controller receives a signal from the load circuit when the fault is cleared in the load circuit.

14. A circuit breaker coupled between a power line circuit (PLC) and a load circuit, the circuit breaker comprising:
   a first branch of the circuit breaker comprising at least one solid-state snubber;
   a second branch of the circuit breaker coupled in parallel to the first branch and comprising a superconductor and a cryogenic contactor coupled in series; and
   a control mechanism for:
      maintaining the at least one solid-state snubber in a deactivated state to prevent current from flowing through the first branch when electrical current from the PLC is below a PLC threshold current value;
      activating the at least one solid-state snubber when electrical current from the PLC is above the PLC threshold current value, and
      deactivating the at least one solid-state snubber when the electrical current from the PLC transitions from flowing from the second branch to the first branch.

15. The circuit breaker of claim 14 wherein, when electrical current from the PLC is below a PLC threshold current value, an impedance of the at least one solid-state snubber is automatically higher than an impedance of the superconductor such that the electrical current from the PLC flows through the second branch, and
   wherein, when the electrical current is above the PLC threshold current value, the impedance of the superconductor is automatically higher than the impedance of the at least one solid-state snubber such that the electrical current from the PLC flows through the first branch.

16. The circuit breaker of claim 15, wherein the control mechanism is configured for deactivating the cryogenic contactor when the electrical current flowing through the second branch is reduced to a second threshold current value.

17. The circuit breaker of claim 16, wherein, after a fault in the load circuit is cleared and the electrical current from the PLC is above the second threshold current value and below a nominal current value, the cryogenic contactor is configured for re-activating.

* * * * *